United States Patent
Ranish et al.

(10) Patent No.: US 9,786,529 B2
(45) Date of Patent: Oct. 10, 2017

(54) PYROMETRY FILTER FOR THERMAL PROCESS CHAMBER

(71) Applicant: Applied Materials, Inc., Santa Clara, CA (US)

(72) Inventors: Joseph M. Ranish, San Jose, CA (US); Bruce E. Adams, Portland, OR (US)

(73) Assignee: APPLIED MATERIALS, INC., Santa Clara, CA (US)

(*) Notice: Subject to any disclaimer, the term of this patent is extended or adjusted under 35 U.S.C. 154(b) by 152 days.

(21) Appl. No.: 14/163,623

(22) Filed: Jan. 24, 2014

(65) Prior Publication Data
US 2014/0255862 A1    Sep. 11, 2014

Related U.S. Application Data

(60) Provisional application No. 61/776,365, filed on Mar. 11, 2013.

(51) Int. Cl.
*H01L 21/67* (2006.01)

(52) U.S. Cl.
CPC .. *H01L 21/67248* (2013.01); *H01L 21/67115* (2013.01)

(58) Field of Classification Search
CPC .............. H01L 21/67248; H01L 21/67115
See application file for complete search history.

(56) References Cited

U.S. PATENT DOCUMENTS

| | | | | |
|---|---|---|---|---|
| 5,532,457 A * | 7/1996 | Cobb | ............ | B23K 1/005 219/405 |
| 5,960,158 A * | 9/1999 | Gat | ............ | C30B 31/12 219/390 |
| 6,127,658 A * | 10/2000 | Kohav | ............ | H01L 21/67115 118/725 |
| 6,143,079 A * | 11/2000 | Halpin | ............ | C23C 16/4584 118/620 |
| 6,293,696 B1 | 9/2001 | Guardado | | |
| 6,803,588 B2 | 10/2004 | Kamieniecki | | |
| 6,818,864 B2 * | 11/2004 | Ptak | ............ | C23C 16/481 118/50.1 |
| 7,027,677 B2 * | 4/2006 | Li | ............ | G02B 6/12004 385/130 |

(Continued)

FOREIGN PATENT DOCUMENTS

| | | |
|---|---|---|
| CN | 1475819 A | 2/2004 |
| JP | S60-161616 A | 8/1985 |

OTHER PUBLICATIONS

Chinese Office Action Search Report in related application CN 201480011564.3 dated Mar. 16, 2017.

(Continued)

*Primary Examiner* — Nathaniel Herzfeld
(74) *Attorney, Agent, or Firm* — Patterson + Sheridan LLP

(57) ABSTRACT

Embodiments of the invention generally relate to pyrometry during thermal processing of semiconductor substrates. More specifically, embodiments of the invention relate to a pyrometry filter for a thermal process chamber. In certain embodiments, the pyrometry filter selectively filters selected wavelengths of energy to improve a pyrometer measurement. The pyrometry filter may have various geometries which may affect the functionality of the pyrometry filter.

20 Claims, 2 Drawing Sheets

(56) References Cited

U.S. PATENT DOCUMENTS

| | | | |
|---|---|---|---|
| 2002/0020696 A1* | 2/2002 | Kitamura | G01J 5/0003 219/390 |
| 2003/0183612 A1* | 10/2003 | Timans | C30B 31/12 219/390 |
| 2003/0236642 A1 | 12/2003 | Timans | |
| 2004/0008310 A1* | 1/2004 | Leidig | G02F 1/133634 349/124 |
| 2005/0099532 A1* | 5/2005 | Tseng | H01L 27/14618 348/374 |
| 2006/0104584 A1* | 5/2006 | Livesay | B82Y 10/00 385/129 |
| 2008/0171417 A1 | 7/2008 | Ramachandran et al. | |
| 2009/0088823 A1* | 4/2009 | Barak | A61B 18/203 607/89 |
| 2009/0255921 A1 | 10/2009 | Ranish et al. | |
| 2009/0289053 A1* | 11/2009 | Ranish | H01L 21/67115 219/522 |
| 2010/0074604 A1* | 3/2010 | Koelmel | H01L 21/67098 392/408 |

OTHER PUBLICATIONS

International Search Report and Written Opinion for International Application No. PCT/US2014/015873 dated May 29, 2014.

\* cited by examiner

PYROMETRY FILTER FOR THERMAL PROCESS CHAMBER

CROSS-REFERENCE TO RELATED APPLICATIONS

This application claims benefit of U.S. provisional patent application No. 61/776,365, filed Mar. 11, 2013, which is hereby incorporated by reference.

BACKGROUND

Field

Embodiments of the invention generally relate to pyrometry during thermal processing of semiconductor substrates. More specifically, embodiments of the invention relate to a pyrometry filter for a thermal process chamber.

Description of the Related Art

Rapid Thermal Processing (RTP) is a well-developed technology for fabricating semiconductor integrated circuits. RTP is a process in which the substrate is irradiated with high intensity optical radiation in an RTP chamber to quickly heat the substrate to a relatively high temperature to thermally activate a process in the substrate. Once the substrate has been thermally processed, the radiant energy is removed and the substrate cools. RTP is an energy efficient process because the chamber in which the RTP is performed is not heated to elevated temperature required to process the substrate. In an RTP process, only the substrate is heated. Thus, the processed substrate is not in thermal equilibrium with the surrounding environment, namely the chamber.

The fabrication of integrated circuits involves may steps of depositing layers, photolithographically patterning the layers, and etching the patterned layers. Ion implantation is used to dope active regions in the substrate. The fabrication sequence also includes thermal annealing of the substrate for many uses, such as curing implant damage and activating dopants, crystallization, thermal oxidation and nitridation, silicidation, chemical vapor deposition (CVD), vapor phase doping, and thermal cleaning among others.

Although annealing in early stages substrate processing technology involved heating multiple substrate for long periods in an annealing oven, RTP has been increasingly used to satisfy ever more stringent requirements for processing substrates with increasingly smaller circuit features. RTP is typically performed in a single substrate chamber by irradiating a substrate with light from an array of high intensity lamps directed at the front face of the substrate on which the integrated circuits are formed. The radiation is at least partially absorbed by the substrate and quickly heats the substrate to a desired high temperature. The desired temperatures generally are above 600° C. and in certain applications, above 1000° C. The radiant heating can be quickly activated and deactivated to controllably heat the substrate over short time intervals, such as between about 60 seconds and about 1 second.

During certain processes, lower temperatures (i.e. less than 400° C.) may be required. An example of using lower temperatures includes forming silicides on a substrate. The quality and performance of processing a substrate in a chamber depends in part on the ability to provide and maintain an accurate temperature of the substrate. Temperatures of a substrate in a processing chamber are usually measured by a pyrometer, which measures temperature within a bandwidth of wavelengths. Radiation that is within the radiation pyrometer bandwidth, and that originates from the heating source, can interfere with the interpretation of the pyrometer signal if the radiation is detected by the pyrometer. "Leaking" heat radiation, radiation not intended to be measured by the pyrometer, can interfere with the pyrometer reading and provide an inaccurate temperature measurement. Moreover, not all substrates are opaque at the pyrometer bandwidth, especially when the substrate is maintained at lower temperatures. Objects at low temperatures emit thermal radiation at lower intensity than objects at high temperatures. The weak thermal emission of low temperature objects can be overwhelmed by other heat signals and lost.

Accordingly, what is needed in the art are improved systems to measure temperatures accurately with a pyrometer. More specifically, what is needed is a pyrometry filter for a thermal processing chamber.

SUMMARY

Embodiments of the invention generally relate to pyrometry during thermal processing of semiconductor substrates. More specifically, embodiments of the invention relate to a pyrometry filter for a thermal process chamber.

BRIEF DESCRIPTION OF THE DRAWINGS

So that the manner in which the above recited features of the invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments of the invention generally relate to pyrometry during thermal processing of semiconductor substrates. More specifically, embodiments of the invention relate to a pyrometry filter for a thermal process chamber.

Embodiments of the invention provide a thermal processing chamber for processing a substrate. Substrate temperature in a thermal processing chamber is often measured by radiation pyrometry. Substrate temperature can be determined through radiation pyrometry by measuring the emissivity of the substrate and applying known radiation laws to calibrate a pyrometer for accurate temperature measurements. Radiation from a heating source (i.e. lamps) that is within the bandwidth or wavelength range of the pyrometer can interfere with the interpretation of the pyrometer signal if the interfering radiation is detected by the pyrometer. Radiation from the source may reach the pyrometer due to leakage around, or transmission through, the substrate. Such radiation may occur during operation of the thermal processing chamber, and may interfere with pyrometry when the substrate is at a temperature below about 450° C.

Figure 1:
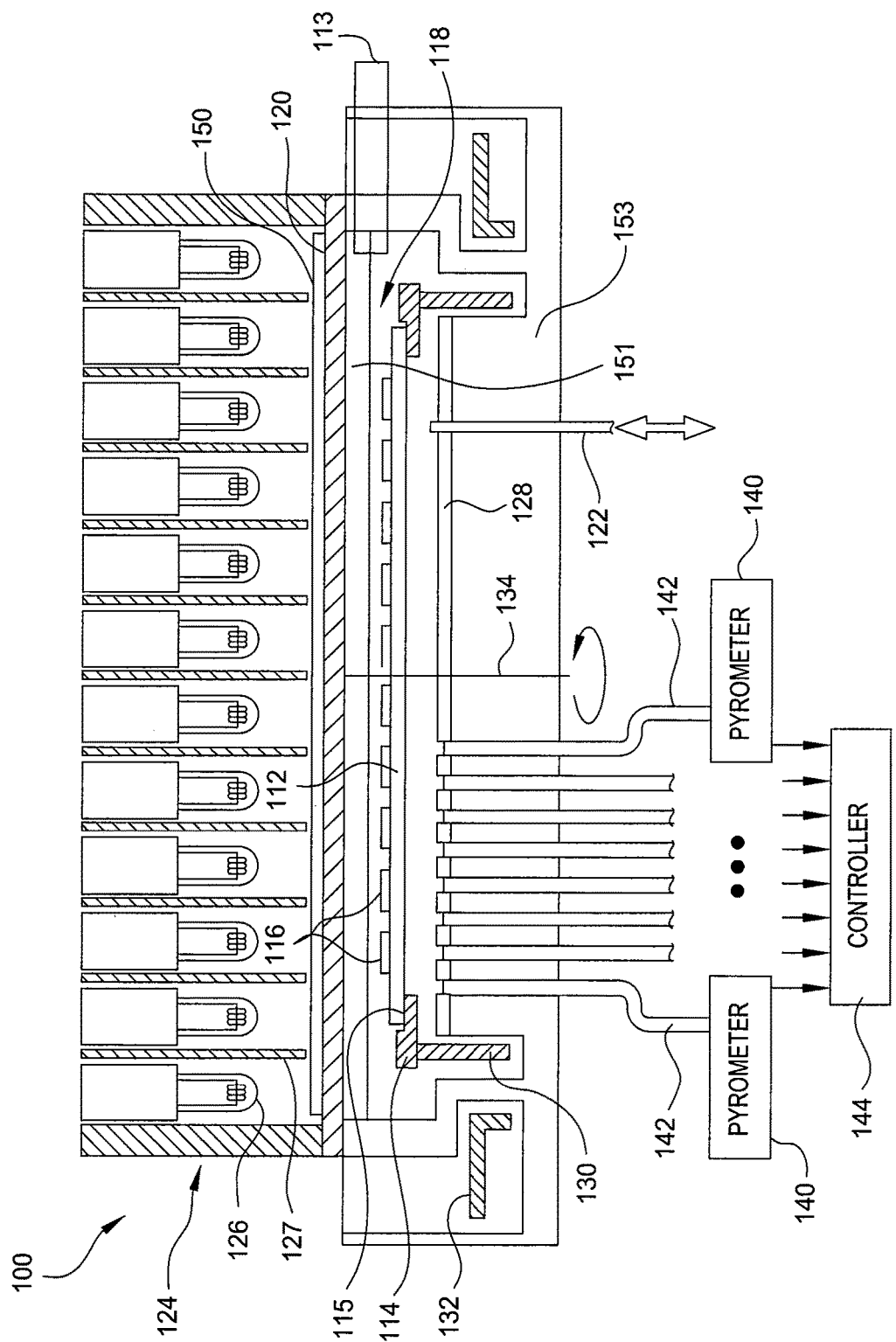
FIG. 1 is a cross-sectional view of a rapid thermal processing chamber according to certain embodiments described herein.

FIG. 1 is a cross-sectional view of a rapid thermal processing chamber according to certain embodiments described herein. Further description of the thermal processing chamber and instrumentation that may be used by embodiments herein are disclosed in commonly assigned U.S. Pat. Nos. 5,848,842 and 6,179,466, which are hereby incorporated by reference in their entirety to the extent not inconsistent with the claimed invention.

A substrate 112 to be processed in the chamber 100 is provided through the valve or access port 113 into the processing area 118 of the chamber 100. The substrate 112 is supported on its periphery by an annular edge ring 114 having an annular sloping shelf 115 contacting the corner of the substrate 112. A more complete description of the edge ring and its support function may be had by reference to U.S. Pat. No. 6,395,363, which is incorporated by reference in its entirety to the extent not inconsistent with the claimed invention. The substrate 112 is oriented such that processed features 116 already formed on a front surface of the substrate 112 face upwardly toward the process area 118. The process area 118 is defined on its upper side by a transparent quartz window 120. Although shown for schematic illustration, the features 116 on the substrate 112 do not generally project substantial distances beyond the surface of the substrate 112 but constitute patterning within and near the plane of the surface of the substrate 112.

Three lift pins 122 may be raised and lowered to support the back side of the substrate 112 when the substrate 112 is handled between a substrate transfer apparatus, such as a robot blade (not shown), which provides the substrate 112 into the chamber 100 and onto the edge ring 114. In order to heat the substrate 112, a radiant heating apparatus 124 is positioned above the window 120 to direct radiant energy toward the substrate 112. In the chamber 100, the radiant heating apparatus includes a large number of high-intensity tungsten-halogen lamps 126 positioned in respective reflective tubes 127 arranged in a hexagonal close-packed array above the window 120. The array of lamps 126 is generally referred to as the lamphead. However, other radiant heating apparatuses may be substituted to provide radiant heat energy to the chamber 100. Generally, the lamps 126 involve resistive heating to quickly elevate, or ramp up, the temperature of the radiant source. Examples of suitable lamps include incandescent and tungsten halogen incandescent lamps having an envelope of glass or silica surrounding a filament and flash lamps which comprise an envelope of glass or silica surrounding a gas, such as xenon and arc lamps that may comprise an envelope of glass, ceramic, or silica that may surround a gas or vapor. Such lamps generally provide radiant heat when the gas is energized. As provided herein, the term lamp is intended to include lamps having an envelope that surrounds a heat source. The "heat source" of a lamp refers to a material or element that can increase the temperature of the substrate, for example, a filament or gas than may be energized.

As provided herein, rapid thermal processing (RTP) refers to an apparatus of a process capable of uniformly heating a substrate at rates of about 50° C./sec and higher, for example at rates of about 100° C. to about 150° C./sec, and about 200° to about 400° C./sec. Typical ramp-down (cooling) rates in RTP chamber are in the range of about 80° C. to about 150° C./sec. Some processes performed in RTP chambers require variations in temperature across the substrate of less than a few degrees Celsius. Thus, an RTP chamber may include a lamp or other suitable heating system and heating system control capable of heating at a rate of up to about 100° C. to about 150° C./sec, and about 200° to about 400° C./sec.

Certain embodiments of the invention may also be applied to flash annealing. As used herein, flash annealing refers to annealing a substrate in under 5 seconds, such as less than 1 second, and in certain embodiments, milliseconds.

In an RTP chamber, the temperature across the substrate 112 may be controlled to a closely defined temperature that is uniform across the substrate 122. A passive manner of improving the efficiency includes a reflector 128 extending parallel to an over an area greater than the substrate 112 and facing the back side of the substrate 122. The reflector 128 efficiently reflects heat radiation emitted from the substrate 112 back to the substrate 112. The spacing between the substrate 112 and the reflector 128 may be within the range of about 3 mm to about 9 mm, and the aspect ratio of the width to the thickness of the cavity is advantageously greater than about 20 mm. In certain embodiments, a reflector plate is applied to enhance the apparent emissivity of the substrate 112. The reflector 128, which may have a gold coating or multilayer dielectric interference mirror, effectively form a black-body cavity at the back of the substrate 112 that functions to distribute heat from warmer portions of the substrate 112 to cooler portions. The black-body cavity is filled with a radiation distribution, usually described in terms of a Planck distribution, corresponding to the temperature of the substrate 112 while the radiation from the lamps 126 has a distribution corresponding to the much higher temperatures associated with the lamps 126. The reflector 128 is disposed on a water-cooled base 153 made of a material, such as a metal, chosen for its ability to heat sink excess radiation from the substrate 112, especially during cool down. Accordingly, the process area 118 of the chamber 100 has at least two substantially parallel walls. A first wall comprises the quartz window 120 and a second wall 153 is substantially parallel to the first wall. The second wall 153 may be made of a material that is significantly non-transparent, such as a metal.

One way of improving the uniformity includes supporting the edge ring 114 on a rotatable cylinder 130 that is magnetically coupled to a rotatable flange 132 positioned outside the chamber 100. A motor (not shown) rotates the flange 132 and hence rotates the substrate 112 about its center 134, which is also the centerline of the generally symmetric chamber 100.

Another manner of improving the uniformity divides the lamps 126 into zones arranged in a generally ring-like formation about the central axis 134. Control circuitry varies the voltage delivered to the lamps 126 in the different zones to thereby tailor the radial distribution of radiant energy. Dynamic control of the zoned heating is affected by one or a plurality of pyrometers 140 coupled through one or more optical light pipes 142 positioned to face the back side of the substrate 112 through apertures in the reflector 128. The one or plurality of pyrometers 140 measure the temperature across a radius of the stationary or rotating substrate 112. The light pipes 142 may be formed of various structures including sapphire, metal, and silica fiber. A computerized controller 144 receives the outputs of the pyrometers 140 and accordingly controls the voltages supplied to the different rings of the lamps 126 to thereby dynamically control the radiant heating intensity and pattern during the processing Pyrometers generally measure light intensity in a narrow wavelength bandwidth of, for example, about 40 nm, in a range between about 700 nm to 1000 nm. The controller 144 or other instrumentation converts the light intensity to a temperature through the well known Planck spectral distribution of light intensity radiating from a black-body held at that temperature. The pyrometers 140, however, are affected by the emissivity of the portion of the substrate 112 being measured. Emissivity ( ) can vary between 1 for a black-body to 0 for a perfect reflector. The pyrometry can be improved by further including an emissometer or reflectometer to optically probe the wafer to measure the emissivity or reflectance of the portion of the wafer it is facing in the relevant wavelength range and the control algorithm within the controller 144 to include the measured emissivity.

As noted above, substrate temperature in the process area 118 of the processing chamber 100 is commonly measured by radiation pyrometry. While radiation pyrometry can be highly accurate, radiation from the heating source that is within the radiation pyrometer bandwidth may interfere with the pyrometer signal if this radiation is detected by the pyrometer. In RTP systems, such as those available from Applied Materials, Inc. Santa Clara, Calif., and other manufacturers, the interfering bandwidth radiation may be minimized by a process kit and by the substrate itself. The process kit couples the substrate with the rotation system. The process kit generally includes a support cylinder 130 and may also include a support ring, which is similar to the edge ring 114.

In general, one or more pyrometers 140 may be positioned in such a manner that the substrate 112 shields the radiation source 126 from the pyrometer 140. A substrate 112 may be largely transparent to radiation for wavelengths greater than or about 1000 nm. Accordingly, one way to limit heat source radiation from reaching the pyrometer is to measure radiation at wavelengths at which the substrate 112 may be substantially opaque. For example, a silicon wafer may be substantially opaque at wavelengths less than about 1000 nm. Nevertheless, as mentioned above, the process kits can "leak" source radiation around the substrate, and not all substrates are opaque at the pyrometer bandwidth, especially when the substrate is at a temperature lower than about 450° C., such as lower than about 250° C.

One way to block the radiation originating from the radiation source 126 is to prevent the source radiation in the pyrometer bandwidth from reaching the substrate 112, for example by reflecting back to the radiation source 126. This may be accomplished by coating the window 120 that separates the radiation source 126 from the processing area 118 with a material that reflects the pyrometer bandwidth radiation while permitting sufficient source radiation for heating to pass through the window 120. In one embodiment, a film of reflective coating 150 may be disposed on the side of the window 120 facing the radiation source 126. In another embodiment, a reflective coating 151 may be disposed on the side of the window 120 facing the substrate. In the embodiment shown in FIG. 1, a reflective coating 150 and 151 may be disposed to both sides of the window 120. In this embodiment, the entire window 120 comprises a reflective coating disposed on the surfaces of the window 120 with no interruption between the reflective coating 150 and 151 and the window 120. Further, there are no gaps or openings in the window 120 that disrupt or break the continuous reflective layer 150 and 151 disposed on the window 120.

By covering the window 120 with a reflective coating in the range of wavelengths at which the pyrometer 140 is sensitive, substantially no radiation from the radiation source 126 in that range of wavelengths will reach the substrate 112. Accordingly, when the pyrometer 140 detects radiation in the range of wavelengths it is configured to detect, substantially all of the radiation measured will be from the substrate 112. The pyrometer 140 measurement will be subject to minimal interference even if the substrate 112 is transparent to the pyrometer bandwidth, for example when a substrate 112 is processed below about 400° C., such as about 250° C. The use of the reflective coating(s) or layer(s) improves the measurement accuracy of the pyrometer 140.

In one embodiment, the window 120 may be removed from the chamber 100 and may be coated by one or more layers of reflective material. Removing the window 120 from the chamber 100 makes servicing of the reflective coating for repair or re-application of the reflective coating relatively easy to perform. Having the ability to remove the window is also helpful should the window ever need to be replaced. The reflective behavior of the film coating depends on the materials selected and the quantity and thickness of the layers deposited. Processes and providers of services to provide windows with thin layers of reflective coatings for reflection in a specified range of wavelengths are known. In one embodiment, materials used for the reflective layer may be a single layer, alternating layers, or any combination of high index and low index dielectric materials that are substantially transparent to most of the wavelengths of radiation emitted from the radiation source 126. Such materials include, for example, titania-silica or tantala-silica. In one embodiment, the reflective layer is made of up $SiO_2$ and $Ta_2O_5$ layers, wherein the outermost (the last deposited layer) being $SiO_2$. In certain embodiments, the dielectric layer film stack may include $SiO_2$, $TiO_2$, $Ta_2O_5$, $Nb_2O_5$, and combinations thereof. The ordered layering of a dielectric film stack may be selected to provide desirable reflective characteristics for a desired wavelength, such as a pyrometer bandwidth.

In certain embodiments, a pyrometer 140 or plurality of pyrometers are used to measure relatively low temperatures below about 400° C., such as below about 250° C. The pyrometer 140 detects radiation within a range of wavelengths of about 700-1000 nm. The range of wavelengths radiated by the radiation source 126 in a processing chamber 100 generally ranges from below 700 nm to above 5.5 micron. Materials such as quartz are opaque at wavelengths above about 5.5 micron. When radiation with wavelengths between about 700-1000 nm is reflected back to the radiation source 126, sufficient radiation of other wavelengths is still available from the radiation source 126 to heat the substrate 112 to temperatures below about 400° C.

FIGS. 2A-D are cross-sectional views of a window according to various embodiments of the invention. The windows depicted in FIGS. 2A-2D may generally be used in the chamber 100 described in FIG. 1 or other RTP chambers using pyrometers for temperature measurement. In the embodiments depicted in FIGS. 2A-2D, the windows comprise a quartz material and the reflective coatings may be selected from previously discussed materials suitable for forming a reflective coating on a window. It is also contemplated that the window may also comprise materials other than quartz, such as alumina, yttria, glasses, aluminobariasilicate hard glass, or other substantially transparent ceramics.

Figure 2A:
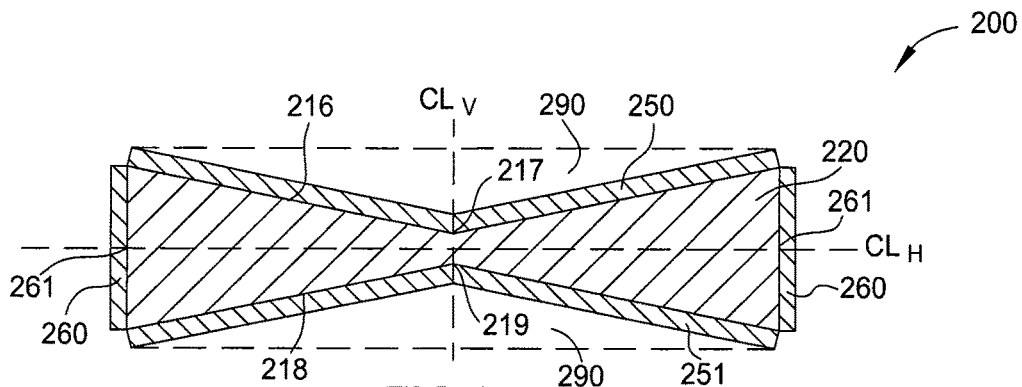
FIGS. 2A-D are cross-sectional views of a window according to various embodiments of the invention.

FIG. 2A is a cross-sectional view of a window according to one embodiment of the invention. A window 220 for use in a thermal processing chamber is provided. The window 220 comprises a quartz material. The window 220 comprises a top surface 216, a bottom surface 218, and a peripheral region 261. In one embodiment, the top surface 216 is the side of the window 220 that faces a radiation source and the bottom surface 218 is the side of the window 220 facing a processing area. A top center region 217 of the window 220 is located at a point substantially equidistant to any point on the peripheral region 261 when viewed from the top (viewed from the radiation source). In this embodiment, the window 220 is substantially circular in shape and the top center region 217 corresponds to the origin of the circular window 220 and any measurement of the window's diameter must pass through the top center region 217. A bottom center region 219 of the window 220 is located at a point substantially equidistant to any point on the peripheral region 261 when viewed from the bottom (viewed from the process area). In this embodiment, the window 220 is substantially circular in shape and the bottom center region 219 corresponds to the origin of the circular window 220 and any measurement of the window's diameter must pass through the bottom center region 219. In embodiments where the window 220 is not circular, the top center region 217 and bottom center region 219 are located substantially in the center of the shape of the window 220.

The window 220 may be substantially symmetrical along a vertical centerline ($CL_V$). The window 220 may also be substantially symmetrical along a horizontal centerline ($CL_H$). In one embodiment, the top surface 216 extends radially outward from the top center region 217 to the peripheral region 261. The top surface 216 remains substantially linear between the top center region 217 and the peripheral region 261. In another embodiment, the bottom surface 218 extends radially outward from the bottom center region 219 to the peripheral region 261. The bottom surface 218 remains substantially linear between the bottom center region 219 and the peripheral region 261. In both embodiments, a distance between the center regions 217 and 219 is less than a distance between the top surface 216 and the bottom surface 218 at the peripheral region 261. In one embodiment, the peripheral region 261 is substantially parallel with the vertical centerline. Thus, the window 220 exhibits a thick edge and a thin center.

The geometric shape of the window 220 also affects the amount of radiation that eventually reaches the substrate. The window 220 exhibits a taper, defined as the relationship between the top surface 216 and the bottom surface 218, which increases across the window 220 from the center regions 217 and 219 to the peripheral region 261. The taper of the window 220 is related to the amount of radiation that reaches the substrate and may be determined by the Fresnel equation. Thus, if a greater taper of the window 220 is present, less radiation will reach the substrate. If a lesser taper of the window 220 is exhibited, more radiation will reach the substrate. This principle results from the physical characteristics of light regarding the ratio of reflection (taper of the window 220) to transmission.

The angle of incidence is an important factor in adjusting the ratio of reflection to transmission. In one embodiment, the taper is designed such that most of the radiation leaving a radiation source has an angle of incidence at the top surface 216 or the bottom surface 218 is not greater than 45°. In this embodiment, the window may be formed to have an angle of incidence between about 0° to about 45° and an amount of radiation not reflected is approximately equal to a horizontal taper angle of the window 220. If uniform intensity is present over the angle of incidence, the reflected radiation equals the taper angle/90°. For example, if the window 220 exhibits a 45° taper, approximately half of the light is reflected. The window 220 may also affect the uniformity of the irradiance at the substrate by altering the optical path length of the light. As such, the window 220 may contain characteristics of a lens.

A reflective coating, such as those previously described, may be disposed on desired surfaces of the window 220. In one embodiment, a reflective coating 250 may be disposed on the top surface 216 of the window 220. In another embodiment, a reflective coating 251 may be disposed on the bottom surface 218 of the window 220. In another embodiment, the window 220 comprises the coating 250 on the top surface 216 and the coating 251 on the bottom surface 218. The reflective coatings 250 and 251 may be deposited by any convenient method, such as CVD, PVD, or liquid coating methods. However, the coatings 250 and 251 may be deposited in such a manner that reflects the topography of the top surface 216 and bottom surface 218 of the window 220. The thickness of the reflective coatings 250 and 251 may be selected to increase or decrease the amount of radiation that reaches the substrate.

In certain embodiments, an absorptive coating 260 may be disposed on the peripheral region 261. In one embodiment, the window 220 peripheral region 260 may face a beam dump (not shown), for example, an absorbing surface often in the form of a v-cross sectioned cavity to enhance the net absorbance. The absorptive coating 260 comprises a material that absorbs radiation within a certain wavelength. Absorptive materials may be carbon black, graphite, SiC, black chrome oxide, copper oxide, etc. The absorptivity can be further enhanced by texturing the window surface. Generally, the absorptive coating 260 is selected to absorb wavelengths that correspond to the pyrometer bandwidth. If the window 220 comprises two reflective coatings, such as a reflective coating 250 on the top surface 216 and a reflective coating 251 on the bottom surface 218, a "hall of mirrors" effect may be produced. The "hall of mirrors" effect results from the reflected wavelength of light being continually reflected within the window 220 between the opposing reflective coatings 250 and 251. The absorptive coating 260 generally prevents the "hall or mirrors" effect by absorbing the wavelengths of reflected light and preventing the reflected wavelengths from continually reflecting within the window 220. The geometric shape of the window 220 directs the reflected wavelengths toward to the absorptive coating 260. In this way, the absorptive coating 260 may be an anti-reflective coating.

In another embodiment, the window 220 may optionally comprise an index matching material 290 (shown in shadow). The index matching material 290 is generally selected to match the refractive index of the non-coated portion of the window 220, although different index material with corresponding adjusted thickness may also be used. Use of the index matching material 290 reduces the geometrical optic effects of the variable thickness window 220 by making the thickness of the window 220 substantially uniform.

Figure 2B:
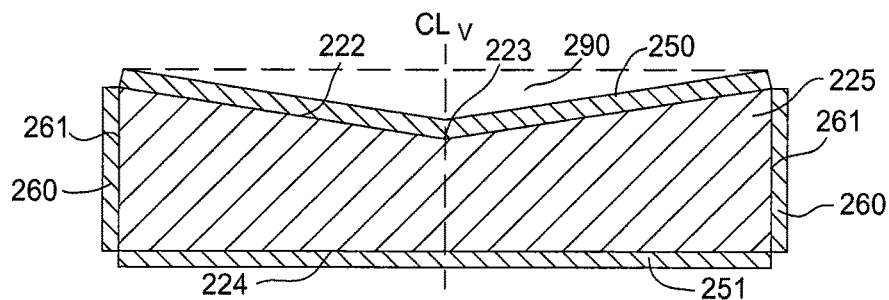

FIG. 2B is a cross-sectional view of a window according to another embodiment of the invention. A window 225 for use in a thermal processing chamber, as described elsewhere herein, is provided. The window 225 comprises a quartz material. The window 225 comprises a top surface 222, a bottom surface 224, and a peripheral region 261. In one embodiment, the top surface 222 is the side of the window 225 that faces a radiation source and the bottom surface 224 is the side of the window 225 facing a processing area. A top center region 223 of the window 225 is located at a point substantially equidistant to any point on the peripheral region 261 when viewed from the top (viewed from the radiation source). In this embodiment, the window 225 is substantially circular in shape and the top center region 223 corresponds to the origin of the circular window 225 and any measurement of the window's diameter must pass through the top center region 223. In one embodiment, the bottom surface 224 is substantially planar.

In one embodiment, the window 225 is substantially symmetrical along a vertical centerline ($CL_V$). In one embodiment, the top surface 222 extends radially outward from the top center region 223 to the peripheral region 261. The top surface 222 remains substantially linear between the top center region 223 and the peripheral region 261. In another embodiment, the bottom surface 224 is substantially planar across a diameter of the window 225 which passes through the top center region 223 between opposing points of the peripheral region 261. In both embodiments, a distance between the center region 223 and the bottom surface 224 is less than a distance between the top surface 222 and the bottom surface 224 at the peripheral region 261. In one embodiment, the peripheral region 261 is substantially parallel with the vertical centerline. Thus, the window 225 exhibits a thick edge and a thin center.

Reflective coatings 250 and 251 and an absorptive coating 260 may be disposed on the window 225. In certain embodiments, the absorptive coating 260 may be replaced by a beam dump as described above. A detailed description with regard to the various coatings may be found above in the description related to FIG. 2A. An index matching material 290 may also be disposed on the window 225. Although similar to the index matching material 290 of FIG. 2A, the index matching material 290 shown in FIG. 2B may be disposed only on the non-planar top surface 222, of the window 225. The top surface 222 may also have the reflective coating 250 disposed thereon. In this embodiment, the index matching material 290 may be disposed on the reflective coating 250. Similar to FIG. 2A, the area occupied by the index matching material 290 (as shown in phantom) may comprise a reflective material. In one embodiment, the thickness and topography of the reflective material may be selected to increase or decrease the transmission of light within a selected wavelength, such as the pyrometer bandwidth.

Figure 2C:
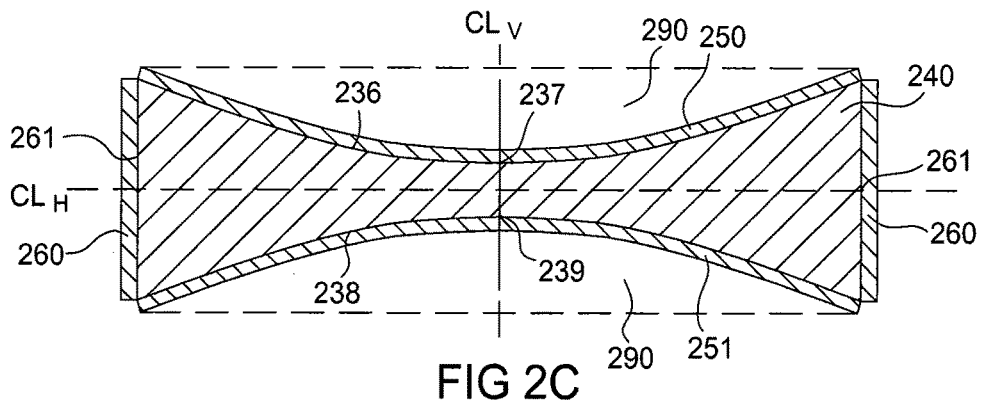

FIG. 2C is a cross-sectional view of a window according to another embodiment of the invention. A window 240 for use in a thermal processing chamber is provided. The window 240 comprises a quartz material. The window 240 comprises a top surface 236, a bottom surface 238, and a peripheral region 261. In one embodiment, the top surface 236 is the side of the window 240 that faces a radiation source and the bottom surface 238 is the side of the window 240 facing a processing area. A top center region 237 of the window 240 is located at a point substantially equidistant to any point on the peripheral region 261 when viewed from the top (viewed from the radiation source). In this embodiment, the window 240 is substantially circular in shape and the top center region 237 corresponds to the origin of the circular window 240 and any measurement of the window's diameter must pass through the top center region 237. A bottom center region 239 of the window 240 is located at a point substantially equidistant to any point on the peripheral region 261 when viewed from the bottom (viewed from the process area). In this embodiment, the window 240 is substantially circular in shape and the bottom center region 239 corresponds to the origin of the circular window 240 and any measurement of the window's diameter must pass through the bottom center region 239.

In one embodiment, the window 240 is substantially symmetrical along a vertical centerline ($CL_V$). In another embodiment, the window 240 is substantially symmetrical along a horizontal centerline ($CL_H$). In one embodiment, the top surface 236 extends radially outward from the top center region 237 to the peripheral region 261. The top surface 236 exhibits non-linear characteristics between the top center region 237 and the peripheral region 261. In another embodiment, the bottom surface 238 extends radially outward from the bottom center region 239 to the peripheral region 261. The bottom surface 238 exhibits non-linear characteristics between the bottom center region 239 and the peripheral region 261. In both embodiments, a distance between the center regions 237 and 239 is less than a distance between the top surface 236 and the bottom surface 238 at the peripheral region 261. In one embodiment, the peripheral region 261 is substantially parallel with the vertical centerline. Thus, the window 220 exhibits a thick edge and a thin center. The top surface 236 and bottom surface 238 are oriented such that the geometry of the window 240 is similar to a concave lens.

Reflective coatings 250 and 251 and an absorptive coating 260 may be disposed on the window 240. A detailed description with regard to the various coatings may be found above in the description related to FIG. 2A. An index matching material 290 may also be disposed on the window 240. Similar to the index matching material 290 of FIG. 2A, the index matching material 290 shown in FIG. 2C may be disposed above the top surface 236 of the window 240 and below the bottom surface 238 of the window 240. Similar to FIG. 2A, the area occupied by the index matching material 290 (as shown in phantom) may comprise a reflective material. In one embodiment, the thickness and topography of the reflective material may be selected to increase or decrease the transmission of light within a selected wavelength, such as the pyrometer bandwidth.

Figure 2D:
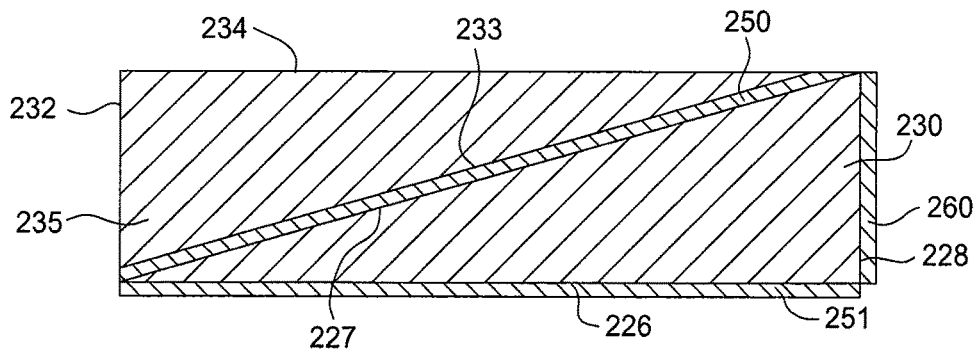

FIG. 2D is a cross-sectional view of a window according to one embodiment of the invention. In one embodiment, a first window 230 and a second window 235 are provided. Together, the windows 230 and 235 form a single window for use in a thermal processing chamber. The windows 230 and 235 comprise a quartz material. The first window 230 comprises a top surface 227, a bottom surface 226, and a first peripheral region 228. In one embodiment, the top surface 227 is adjacent to the second window 235 and the bottom surface 226 is the side of the window 225 facing a processing area. The top surface 227 extends across the diameter of the first window 230 in a linearly diagonal fashion from the first peripheral region 228 to the bottom surface 226 of the first window 230. The first peripheral region 228 is substantially perpendicular to the bottom surface 226. As depicted in the cross-sectional view, the first window 230 resembles a right triangle wherein the top surface 227 forms the hypotenuse of the cross-sectional right triangle.

In certain embodiments, the first window 230 further comprises reflective coatings 250 and 251 and an absorptive coating 260. The reflective coating 250 is disposed on the top surface 227 and the reflective coating 251 is disposed on the bottom surface 226 of the first window 230. The absorptive coating 260 is disposed on the first peripheral region 228. Further description regarding the materials used for the reflective coatings 150 and 151 and the absorptive coating 260 are not discussed here for the sake of brevity but may be found with reference to FIG. 2A.

In another embodiment, the second window 235 comprises a top surface 234, a bottom surface 2233, and a second peripheral region 232. In one embodiment, the bottom surface 233 is adjacent to the first window 230 and the top surface 234 is the side of the window 235 facing a radiation source. The bottom surface 233 extends across the diameter of the second window 235 in a linearly diagonal fashion from the first peripheral region 228 of the first window 230 to the second peripheral region 232 of the second window 235. The second peripheral region 232 is substantially perpendicular to the top surface 234. As depicted in the cross-sectional view, the second window 235 resembles a right triangle wherein the bottom surface 233 forms the hypotenuse of the cross-sectional right triangle.

In one embodiment, the bottom surface 233 of the second window 235 is disposed immediately adjacent the reflective coating 250 formed on the top surface 227 of the first window 230. The first window 230 and the second window 235 "sandwich" the reflective layer 250 so that no space or void is present between the two windows and the reflective layer 250. This is done so as to reduce the number or mediums through which radiation must travel in an effort to prevent unnecessary loss of radiation due to the refractive indicies of multiple media. Although not shown, it is contemplated that, in certain embodiments, the reflective coating 251 may be formed on the top surface 234 of the second window 235. In this embodiment, the reflective coating may be formed on the bottom surface 233 of the second window 235 and the absorptive coating 260 may be formed on the second peripheral region 232 of the second window 235. Furthermore, all non-peripheral surfaces 234, 233, and 226 may be coated by the absorptive coating 260.

An example of an RTP chamber that may use or include embodiments described herein is the RADIANCE® RTP chamber available from Applied Materials, Inc., of Santa Clara, Calif. RTP chamber from other manufacturers may also benefit from use of embodiments described herein. It will be understood that in the Figures described above, the radiation source is positioned above the substrate and the pyrometer is positioned below the radiation source and the substrate. The substrate may also be disposed upside down within the chamber. Other configurations of the processing chamber with varying window geometries are possible and are fully contemplated and within the scope of the invention. For instance, a processing chamber may have a radiation source below a substrate and a pyrometer positioned above a radiation source. These and other variations of positioning of the substrate, radiation source, and pyrometer are possible and are contemplated without fundamentally affecting aspects of the invention described herein.

While the foregoing is directed to embodiments of the invention, other and further embodiments of the invention may be devised without departing from the basic scope thereof, and the scope thereof is determined by the claims that follow.

The invention claimed is:

1. An apparatus for use in a thermal processing chamber comprising:
 a window having a plurality of surfaces including a top surface and a bottom surface, the window having a geometric shape wherein a thickness of the window at a center region is less than a thickness of the window at a peripheral region and wherein the top surface and bottom surface taper inwardly from the peripheral region to the center region;
 a reflective coating disposed on the top surface and the bottom surface;
 an index matching material disposed on the reflective coating adjacent at least one of the top surface and the bottom surface; and
 an absorptive coating disposed on the peripheral region.

2. The apparatus of claim 1, wherein the window comprises quartz.

3. The apparatus of claim 1, wherein the index matching material is selected in relationship to a refractive index of the window.

4. The apparatus of claim 3, wherein the reflective coating is selected to reflect a predetermined range of wavelengths between about 700 nm to about 1000 nm.

5. The apparatus of claim 1, wherein the reflective coating comprises a dielectric material.

6. The apparatus of claim 5, wherein the dielectric material comprises multiple layers.

7. The apparatus of claim 1, wherein the window is symmetric around a vertical axis.

8. The apparatus of claim 7, wherein the window is symmetric around a horizontal axis.

9. The apparatus of claim 1, wherein the plurality of surfaces are linear.

10. The apparatus of claim 1, wherein at least two of the plurality of surfaces are non-linear.

11. A system for processing a substrate, comprising:
 a radiation source;
 a pyrometer; and
 a window disposed between the radiation source and the pyrometer, the window further comprising:
  a peripheral region and a plurality of surfaces including a top surface and a bottom surface, the window having a geometric shape wherein a thickness of the window at a center region is less than a thickness of the window at the peripheral region and wherein the top surface and the bottom surface taper inwardly from the peripheral region to the center region;
  a reflective coating disposed on the top surface and the bottom surface;
  an index matching material disposed on the reflective coating adjacent at least one of the top surface and the bottom surface; and
  an absorptive coating disposed on the peripheral region.

12. The system of claim 11, wherein the pyrometer detects wavelengths between about 700 nm to about 1000 nm.

13. The system of claim 11, wherein the window comprises quartz.

14. The system of claim 11, wherein the index matching material is selected in relationship to a refractive index of the window.

15. The apparatus of claim 14, wherein the reflective coating is selected to reflect a predetermined range of wavelengths between about 700 nm to about 1000 nm.

16. The apparatus of claim 11, wherein the reflective coating comprises a dielectric material.

17. The apparatus of claim 11, wherein the window is symmetric around a vertical axis.

18. The apparatus of claim 17, wherein the window is symmetric around a horizontal axis.

19. The apparatus of claim 11, wherein the plurality of surfaces are linear.

20. The apparatus of claim 11, wherein at least two of the plurality of surfaces are non-linear.

* * * * *